United States Patent
Lee et al.

(10) Patent No.: US 9,583,522 B2
(45) Date of Patent: Feb. 28, 2017

(54) IMAGE SENSOR AND ELECTRONIC DEVICE INCLUDING THE SAME

(71) Applicant: SK hynix Inc., Gyeonggi-do (KR)

(72) Inventors: Won-Jun Lee, Gyeonggi-do (KR); Kyoung-In Lee, Gyeonggi-do (KR); Cha-Young Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 75 days.

(21) Appl. No.: 14/818,829

(22) Filed: Aug. 5, 2015

(65) Prior Publication Data

US 2016/0071894 A1    Mar. 10, 2016

(30) Foreign Application Priority Data

Sep. 4, 2014 (KR) .......... 10-2014-0117894
Jun. 9, 2015 (KR) .......... 10-2015-0080997

(51) Int. Cl.
  *H04N 5/225* (2006.01)
  *H01L 27/146* (2006.01)
  *H04N 9/04* (2006.01)

(52) U.S. Cl.
  CPC .... *H01L 27/14621* (2013.01); *H01L 27/1462* (2013.01); *H01L 27/14625* (2013.01); *H01L 27/14627* (2013.01); *H01L 27/14629* (2013.01); *H04N 9/04* (2013.01)

(58) Field of Classification Search
  CPC .......... H01L 27/14621; H01L 27/1462; H01L 27/14625; H01L 27/14627; H01L 27/14629; H04N 9/04; G02B 3/0018
  USPC ....... 348/294, 308, 272, 273, 275, 277, 348; 257/432
  See application file for complete search history.

(56) References Cited

U.S. PATENT DOCUMENTS

2006/0170810 A1 * 8/2006 Kim .................... G02B 3/0018
                                                       348/340
2012/0273907 A1 * 11/2012 Lim .................. H01L 27/14621
                                                       257/432

* cited by examiner

*Primary Examiner* — Tuan Ho
*Assistant Examiner* — Zhenzhen Wu
(74) *Attorney, Agent, or Firm* — IP & T Group LLP (57) ABSTRACT

Disclosed are an image sensor including a light collection member having a multi-layer step shape and an electronic device including the same. This technology can improve light condensing efficiency in a unit pixel since a corresponding pixel lens is included. Furthermore, light condensing efficiency in a unit pixel can be improved more effectively by controlling the width of a corresponding pixel lens so that the pixel lens corresponds to the wavelength of incident light whose color has been separated by a corresponding color filter. As described above, quantum efficiency in the photoelectric conversion element can also be improved since light condensing efficiency in a unit pixel is improved. As a result, performance of the image sensor can be improved.

20 Claims, 6 Drawing Sheets

|  |  | FIRST LOWER CONDENSING LAYER (μm) | | | |
|---|---|---|---|---|---|
|  |  | 0.66 | 0.76 | 0.86 | 0.96 |
| FIRST UPPER LIGHT LAYER (μm) | 0.27 | 40.46 | 41.67 | 43.25 | 43.44 |
|  | 0.37 | 42.2 | 43.48 | 44.48 | 44.57 |
|  | 0.47 | 43.43 | 45.12 | 45.80 | 45.80 |

FIG. 6

|  |  | SECOND LOWER CONDENSING LAYER (μm) | | | |
|---|---|---|---|---|---|
|  |  | 0.66 | 0.76 | 0.86 | 0.96 |
| SECOND UPPER LIGHT LAYER (μm) | 0.27 | 63.03 | 62.77 | 62.21 | 61.41 |
|  | 0.37 | 63.36 | 63.00 | 62.63 | 61.96 |
|  | 0.47 | 63.57 | 63.26 | 62.97 | 62.38 |

FIG. 7

|  |  | THIRD LOWER CONDENSING LAYER (μm) | | | |
|---|---|---|---|---|---|
|  |  | 0.66 | 0.76 | 0.86 | 0.96 |
| THIRD UPPER LIGHT LAYER (μm) | 0.27 | 45.88 | 45.43 | 44.54 | 43.45 |
|  | 0.37 | 45.82 | 45.41 | 44.52 | 43.39 |
|  | 0.47 | 45.53 | 45.19 | 44.34 | 43.23 |

FIG. 8

IMAGE SENSOR AND ELECTRONIC DEVICE INCLUDING THE SAME

CROSS-REFERENCE TO RELATED APPLICATIONS

The present application claims priority of Korean Patent Application Nos. 10-2014-0117894 and 10-2015-0080997, filed on Sep. 4, 2014 and Jun. 9, 2015, respectively, which are herein incorporated by reference in their entirety.

BACKGROUND

Exemplary embodiments of the present invention relate to a semiconductor device manufacturing technology, and more particularly, to an image sensor including a light condensing member having a multi-layer step shape and an electronic device including the same.

An image sensor converts an optical image into an electrical signal. Recently, due to the development of the computer and communication industries, a demand for an image sensor with improved performance has increased in various devices, such as digital cameras, camcorders, PCS (Personal Communication System), game machines, security cameras, medical micro-cameras, and robots.

SUMMARY

Various embodiments are directed to an image sensor having improved performance and an electronic device including the same.

In an embodiment, an image sensor may include first and second photoelectric conversion elements formed in a first pixel and a second pixel of a substrate, respectively; a first pixel lens formed over the first photoelectric conversion element of the first pixel and comprising a first lower light condensing layer and a first upper light condensing layer, wherein the first upper light condensing layer has a smaller width than the first lower light condensing layer and is formed over the first lower light condensing layer; a first color filter covering the first pixel lens and filtering a visible ray of a first wavelength band; a second pixel lens formed over the second photoelectric conversion element of the second pixel and comprising a second lower light condensing layer and a second upper light condensing layer, wherein the second upper light condensing layer has a smaller width than the second lower light condensing layer and is formed over the second lower light condensing layer, wherein the second pixel lens has a width different from a width of the first pixel lens; and a second color filter covering the second pixel lens and filtering a visible ray of a second wavelength band longer than the first wavelength band.

The image sensor according to an embodiment may further include a focusing layer inserted between the first photoelectric conversion element and the first pixel lens and between the second photoelectric conversion element and the second pixel lens; and an anti-reflection structure formed over the first and the second color filters. The focusing layer may have a greater refractive index than the first and the second pixel lenses. The focusing layer may have a greater area than the first and the second pixel lenses. The anti-reflection structure may include an anti-reflection layer or a hemispherical lens, wherein the anti-reflection layer may include two or more substance layers having different refractive indices from each other, wherein the two or more substance layer may be stacked alternately and repeatedly.

Each of the first and the second pixel lenses may have a multi-layer step shape. The first color filter may include a blue filter, and the second color filter may include a green filter, wherein a width of the first lower light condensing layer may be greater than a width of the second lower light condensing layer, and wherein a width of the first upper light condensing layer may be substantially the same as a width of the second upper light condensing layer. The first color filter may include a green filter, and the second color filter may include a red filter, wherein a width of the first lower light condensing layer may be substantially the same as a width of the second lower light condensing layer, and wherein a width of the first upper light condensing layer may be greater than a width of the second upper light condensing layer. The first color filter may include a blue filter, and the second color filter may include a red filter, wherein a width of the first lower light condensing layer may be greater than a width of the second lower light condensing layer, and wherein a width of the first upper light condensing layer may be greater than a width of the second upper light condensing layer. A width of the first lower light condensing layer exposed by the first upper light condensing layer in the first pixel lens may be smaller than a wavelength of incident light subjected to color separation through the first color filter, and a width of the second lower light condensing layer exposed by the second upper light condensing layer in the second pixel lens may be smaller than a wavelength of incident light subjected to color separation through the second color filter.

In an embodiment, n image sensor may include first, second, and third photoelectric conversion elements formed in a substrate so as to correspond to a first pixel, a second pixel, and a third pixel, respectively; a first pixel lens formed over the first photoelectric conversion element and comprising a first lower light condensing layer and a first upper light condensing layer, wherein the first upper light condensing layer has a smaller width than the first lower light condensing layer and is formed over the first lower light condensing layer; a first color filter covering the first pixel lens and filtering a visible ray of a first wavelength band; a second pixel lens formed over the second photoelectric conversion element and comprising a second lower light condensing layer and a second upper light condensing layer, wherein the second upper light condensing layer has a smaller width than the second lower light condensing layer and is formed over the second lower light condensing layer; a second color filter covering the second pixel lens and filtering a visible ray of a second wavelength band longer than the first wavelength band; a third pixel lens formed over the third photoelectric conversion element and comprising a third lower light condensing layer and a third upper light condensing layer, wherein the third upper light condensing layer has a smaller width than the third lower light condensing layer and is formed over the third lower light condensing layer; and a third color filter covering the third pixel lens and filtering a visible ray of a third wavelength band longer than the second wavelength band, wherein the first pixel lens, the second pixel lens, and the third pixel lens have different widths from each other.

The first color filter may include a blue filter, the second color filter may include a green filter, and the third color filter may include a red filter. A width of the first lower light condensing layer may be greater than each of a width of the second lower light condensing layer and a width of the third lower light condensing layer, and the width of the second lower light condensing layer may be substantially the same as the width of the third lower light condensing layer. A width of the first upper light condensing layer may be substantially the same as a width of the second upper light condensing layer, and each of the width of the first upper light condensing layer and the width of the second upper light condensing layer, may be greater than a width of the third upper light condensing layer.

In an embodiment, an electronic device may include an optical system; an image sensor suitable for receiving light from the optical system; and a signal processing unit suitable for performing a signal processing operation on a signal output from the image sensor. The image sensor may include first and second photoelectric conversion elements formed in a substrate and corresponding to a first pixel and a second pixel, respectively; a first pixel lens formed over the first photoelectric conversion element and comprising a first lower light condensing layer and a first upper light condensing layer, wherein the first upper light condensing layer has a smaller width than the first lower light condensing layer and is formed over the first lower light condensing layer; a first color filter covering the first pixel lens and filtering a visible ray of a first wavelength band; a second pixel lens formed over the second photoelectric conversion element of the second pixel and comprising a second lower light condensing layer and a second upper light condensing layer, wherein the second upper light condensing layer has a smaller width than the second lower light condensing layer, is formed over the second lower light condensing layer, and has a width different from a width of the first pixel lens; and a second color filter covering the second pixel lens and filtering a visible ray of a second wavelength band longer than the first wavelength band.

The electronic device according to an embodiment may further include a focusing layer inserted between the first photoelectric conversion element and the first pixel lens and between the second photoelectric conversion element and the second pixel lens; and an anti-reflection structure formed over the first and the second color filters.

Each of the first and the second pixel lenses may have a multi-layer step shape. The first color filter may include a blue filter, and the second color filter may include a green filter, wherein a width of the first lower light condensing layer may be greater than a width of the second lower light condensing layer, and wherein a width of the first upper light condensing layer may be substantially the same as a width of the second upper light condensing layer. The first color filter may include a green filter, and the second color filter may include a red filter, wherein a width of the first lower light condensing layer may be substantially the same as a width of the second lower light condensing layer, and wherein a width of the first upper light condensing layer may be greater than a width of the second upper light condensing layer. The first color filter may include a blue filter, and the second color filter may include a red filter, wherein a width of the first lower light condensing layer may be greater than a width of the second lower light condensing layer, and wherein a width of the first upper light condensing layer may be greater than a width of the second upper light condensing layer.

DETAILED DESCRIPTION

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated to clearly illustrate features of the embodiments. When a first layer is referred to as being "on" a second layer or "on" a substrate, it not only refers to a case in which the first layer is formed directly on the second layer or the substrate but also a case in which a third layer exists between the first layer and the second layer or the substrate.

The embodiments of the present invention provide an image sensor with improved performance and an electronic device having the same. When light condensing efficiency in unit pixels improves, performance of the image sensor improves accordingly. In general, an image sensor may include a plurality of unit pixels. Each of the unit pixels may include a semi-spherical type micro lens (ML) installed over a photoelectric conversion element. Through the micro lens, incident light may be condensed and transmitted into the photoelectric conversion element. The light condensing efficiency of the unit pixel may depend on the quality of the micro lens. The light condensing efficiency may be controlled according to a focal distance between the micro lens and the photoelectric conversion element.

In a conventional micro lens, the focal distance between the micro lens and the photoelectric conversion element is likely to change during a process of changing the curvature of the micro lens. Thus, it is not easy to control the focal distance.

The micro lens may be formed through a process of reflowing a lens forming material, for example, resist. In such a process, it is difficult to form a hemispherical shape with a desired curvature. Furthermore, since the micro lens is formed over a color filter layer, applicable materials are limited. In addition, the reflow process may require a high cost, may be formed only as a hemispherical shape, and may have difficulties in forming a micro lens with a symmetrical and uniform shape. This may increases crosstalk.

The following embodiments of the present invention provide an image sensor with improved light condensing efficiency in unit pixels and an electronic device having the same. For this structure, each of the unit pixels may include a pixel lens having a plurality of light condensing layers which are stacked over a photoelectric conversion element. A lower layer of the stack has a larger area or critical dimension (CD) than an upper layer of the stack. Thus, the pixel lens may have a multilayer stepped structure. The pixel lens having a multilayer stepped structure exhibits sub-wavelength optics or sub-wavelength effects and can condense incident light as a hemispherical micro lens does. The pixel lens can effectively condense light within a limited area. Thus, the pixel lens according to an embodiment is advantageous in increasing integration of the image sensor and can easily vary a focal distance. According to the sub-wavelength optics, an optical effect can be obtained in a spatial scale smaller than a half of a wavelength of incident light.

Figure 1:
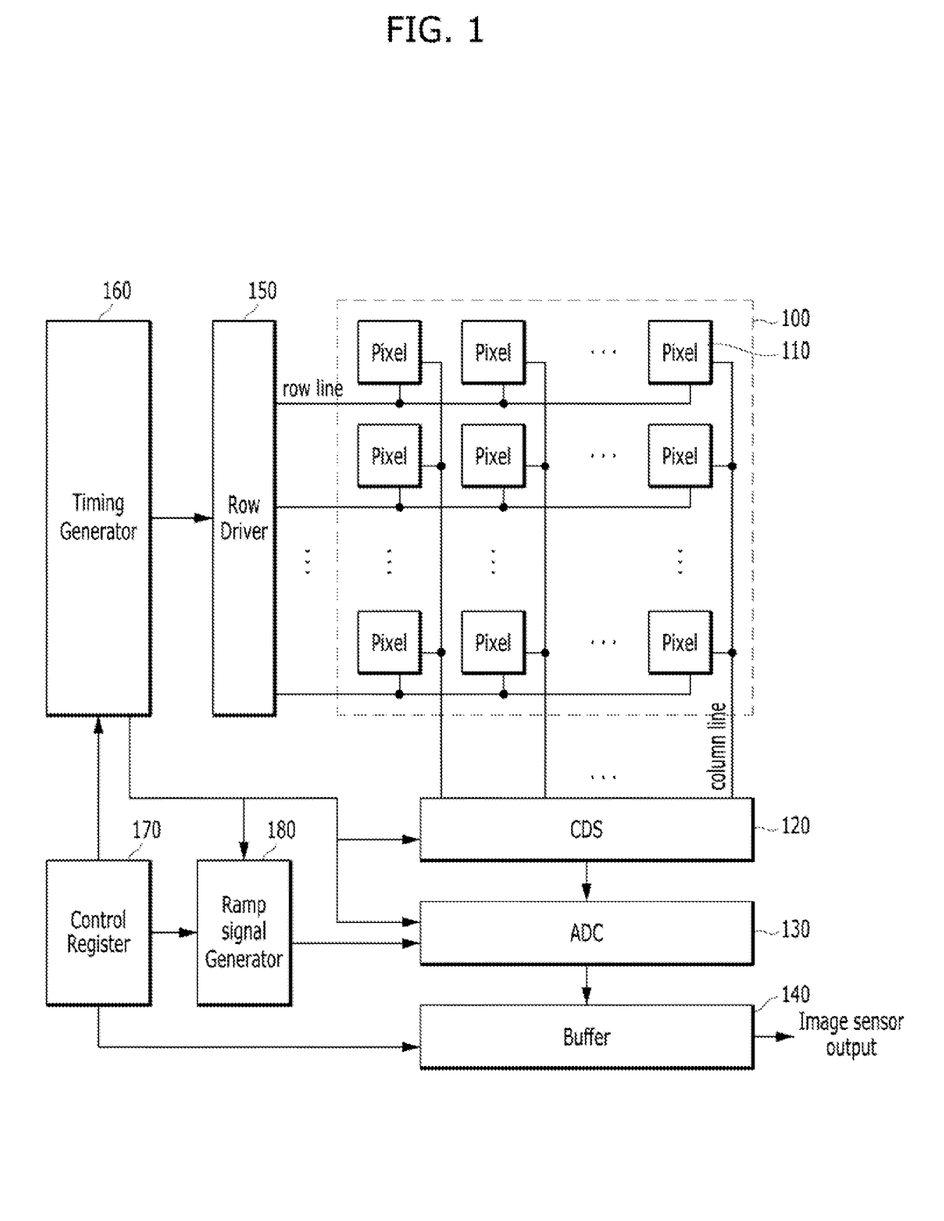
FIG. 1 is a block diagram schematically illustrating an image sensor in accordance with an embodiment of the present invention.

FIG. 1 is a block diagram schematically illustrating an image sensor in accordance with an embodiment of the present invention.

As illustrated in FIG. 1, the image sensor in accordance with an embodiment of the present invention may include a pixel array 100, a correlated double sampling (CDS) 120, an analog-digital converter (ADC) 130, a buffer 140, a row driver 150, a timing generator 160, a control register 170, and a ramp signal generator 180. The pixel array 100 may include a plurality of unit pixels 110 arranged in a matrix shape.

The timing generator 160 may generate one or more control signals for controlling the row driver 150, the CDS 120, the ADC 130, and the ramp signal generator 180. The control register 170 may generate one or more control signals for controlling the ramp signal generator 180, the timing generator 160, and the buffer 140.

The row driver 150 may drive the pixel array 100 on a row line basis. For example, the row driver 150 may generate a select signal for selecting any one row line of a plurality of row lines. Each of the unit pixels 110 may sense incident light and output an image reset signal and an image signal to the CDS 120 through a column line. The CDS 120 may perform sampling on the image reset signal and the image signal.

The ADC 130 may compare a ramp signal outputted from the ramp signal generator 180 with a sampling signal outputted from the CDS 120, and output a comparison signal. According to a clock signal provided from the timing generator 160, the ADC 130 may count the level transition time of the comparison signal, and output the count value to the buffer 140. The ramp signal generator 180 may be operated under control of the timing generator 160.

The buffer 140 may store a plurality of digital signals outputted from the ADC 130, and then sense and amplify the digital signals. Thus, the buffer 140 may include a memory (not illustrated) and a sense amplifier (not illustrated). The memory may serve to store count values. The count values are related to signals outputted from the plurality of unit pixels 110. The sense amplifier may serve to sense and amplify the count values outputted from the memory.

In the above-described image sensor, each of the unit pixels may include a pixel lens capable of improving light condensing efficiency. Hereinafter, a unit pixel including a pixel lens will be described in detail with reference to the accompanying drawings.

Figure 2A:
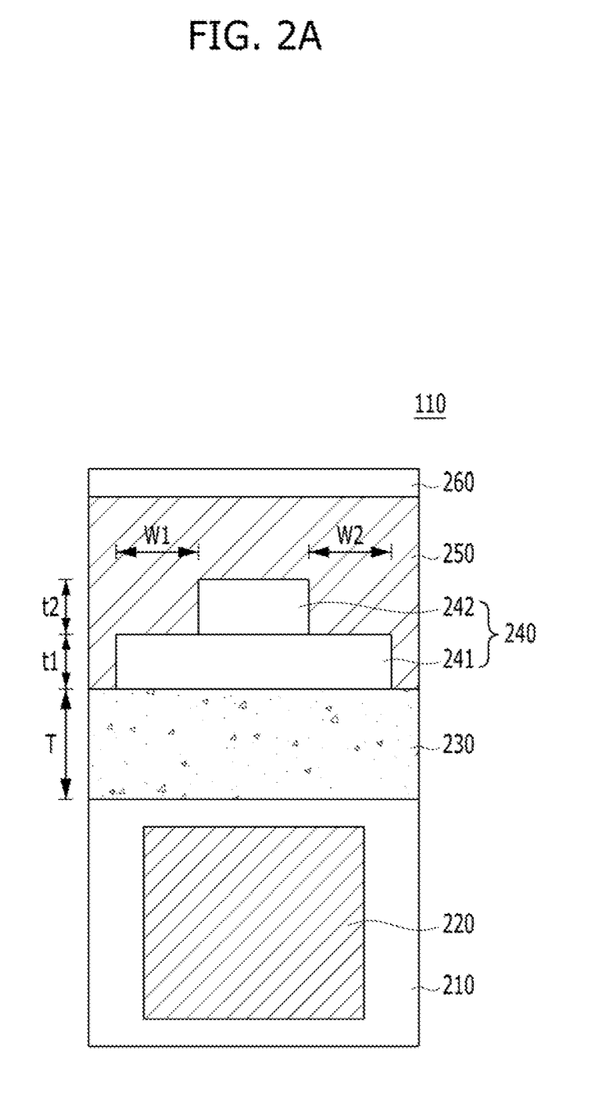
FIG. 2A is a cross-sectional view illustrating a unit pixel of the image sensor in accordance with an embodiment of the present invention.
Figure 2B:
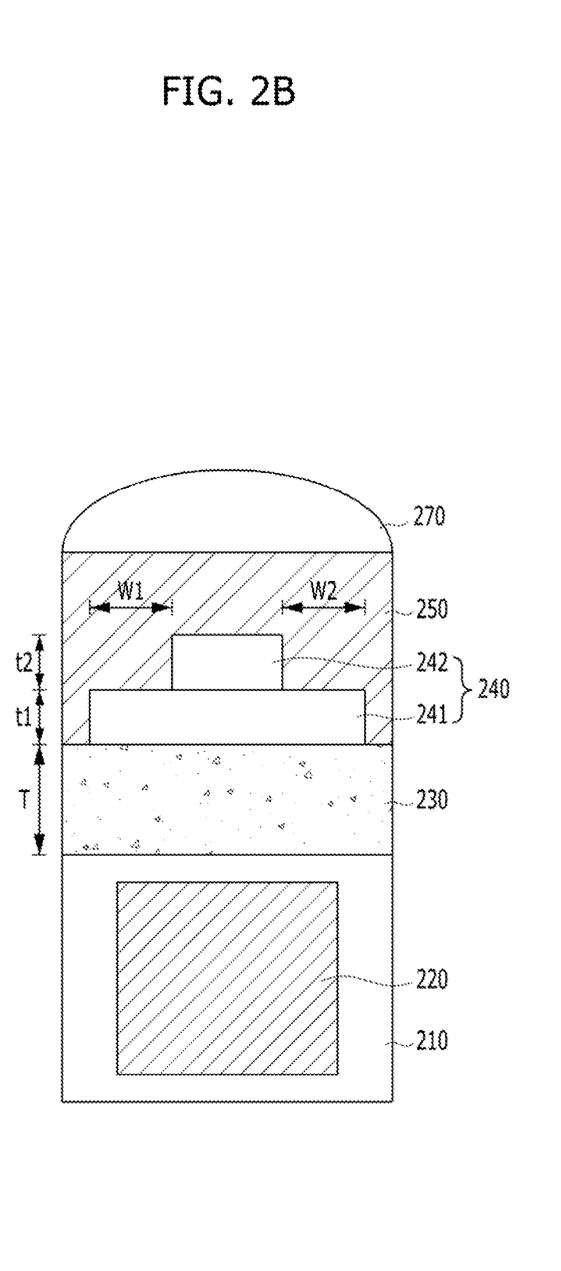
FIG. 2B is a cross-sectional view illustrating another embodiment of the present invention.

FIG. 2A is a cross-sectional view illustrating a unit pixel of an image sensor in accordance with an embodiment of the present invention, and FIG. 2B is a cross-sectional view illustrating another embodiment of the present invention.

As illustrated in FIGS. 2A and 2B, each of the unit pixels 110 may include a substrate 210, a focusing layer 230, a pixel lens 240, a color filter layer 250, and an anti-reflection structure 260 or 270. The substrate 210 may include a photoelectric conversion element 220. The focusing layer 230 may be formed over the substrate 210. The pixel lens 240 may be formed over the focusing layer 230 and include a plurality of light condensing layers. The plurality of light condensing layers in which a lower layer has a larger area or critical dimension (CD) than an upper layer. The color filter layer 250 may be formed over the focusing layer 230 so as to cover the pixel lens 240. The anti-reflection structure 260 or 270 may be formed over the color filter layer 250.

In the present embodiment, the pixel lens 240 may include a first light condensing layer 241 formed over the focusing layer 230 and a second light condensing layer 242 formed over the first light condensing layer 241 and having a smaller area than the first light condensing layer 241. The first light condensing layer 241 may form the lower layer, and the second light condensing layer 242 may form the upper layer. Thus, the first light condensing layer may also be referred to as a lower layer, and the second light condensing layer may also be referred to as an upper layer.

The substrate 210 may include a semiconductor substrate. The semiconductor substrate may have a single crystal state and include a silicon-containing material. For example, the substrate 210 may include a single-crystal silicon containing material.

The photoelectric conversion element 220 may include photo diodes. For example, the photoelectric conversion element 220 formed over the substrate 210 may include a plurality of photoelectric conversion layers (not illustrated) which are vertically stacked. Each of the photoelectric conversion layers may serve as a photodiode including an N-type impurity region and a P-type impurity region.

The focusing layer 230 may serve to adjust a distance at which incident light condensed through the pixel lens 240 reaches the photoelectric conversion element 220, that is, a focal distance. Due to the focusing layer 230, the focal distance may be adjusted without a variation of curvature, unlike a conventional device in which the focal distance is adjusted using a hemispherical micro lens with a given curvature. Furthermore, a shorter focal distance may be set within a limited space. The focal distance may be inversely proportional to the thickness T of the focusing layer 230. For example, the focal distance may be shortened as the thickness T of the focusing layer 230 is increased and lengthened as the thickness T of the focusing layer 230 is decreased.

To effectively transmit the incident light condensed through the pixel lens 240 to the photoelectric conversion element 220, the focusing layer 230 may have the same area as or a larger area than the pixel lens 240. The focusing layer 230 may have a shape corresponding to each of the unit pixels 110. Thus, between the adjacent unit pixels 110, the focusing layers 230 may be in contact with each other. For example, the focusing layer 230 may have a rectangular shape.

To more effectively transmit the incident light condensed through the pixel lens 240 to the photoelectric conversion element 220, the focusing layer 230 may have a larger refractive index than the pixel lens 240. As for the focusing layer 230, any materials having a larger refractive index than the pixel lens 240 may be applied.

Since the focusing layer 230 is positioned at the bottom of the color filter layer 250, various materials used in a typical semiconductor fabrication process can be applied. For example, transparent materials which can be applied as the focusing layer 230 may include inorganic materials such as silicon oxide, silicon nitride, and titanium nitride. The focusing layer 230 may have a single-layer structure or multilayer structure in which transparent materials having different refractive indexes are stacked. When the focusing layer 230 has a multilayer structure, the refractive index of the focusing layer 230 may vary depending on location. For example, the refractive index of a layer located at a lower level may have a higher refractive index than a layer located at a higher level.

The pixel lens 240 may serve as a light condensing member to condense incident light. To improve light condensing efficiency, the pixel lens 240 may have a multilayer structure in which two or more light condensing layers 241 and 242 are stacked. The upper layer 242 may have a smaller area or CD than the lower layer 241. Thus, the pixel lens 240 may have a multilayer stepped structure. When the pixel lens 240 has a multilayer stepped structure, the difference in width between the upper layer 242 and the lower layer 241, that is, each of the widths W1 and W2 may be smaller than the wavelength of incident light. That is, in the pixel lens, the lower layer exposed by the upper layer has a smaller width than the wavelength of incident light. More specifically, the difference in width, that is, each of the widths W1 and W2 between the upper layer 242 and the lower layer 241 may be smaller than the wavelength of the incident light of which colors are separated through the color filter layer 250. Through this structure, the pixel lens 240 having a multilayer stepped structure can condense light as a conventional hemispherical lens does. This is based on the sub-wavelength optics. The widths W1 and W2 form step widths between the upper layer 242 and the lower layer 241 at both ends respectively, and may be equal to each other (W1=W2) or different from each other (W1≠W2).

The plurality of light condensing layers 241 and 242 may have the same shape, and be stacked vertically. Specifically, the plurality of light condensing layers 241 and 242 may have a circular shape, a polygonal shape including a quadrangular shape, or the like.

To further improve light condensing efficiency, the thickness t2 of the upper layer 242 may be equal to the thickness t1 of the lower layer 241 (t1=t2), or smaller than the thickness t1 of the lower layer 241 (t1>t2). Furthermore, to further improve light condensing efficiency, the upper layer 242 may have the same refractive index as or a smaller refractive index than the lower layer 241. The plurality of light condensing layers 241 and 242 may include a transparent material. When the upper layer 242 and the lower layer 241 have the same refractive index, the upper layer 242 and the lower layer 241 may be formed of the same material.

Since the plurality of light condensing layers 241 and 242, that is, the pixel lens 240 is positioned at the bottom of the color filter layer 250, various materials used in a typical semiconductor fabrication process may be applied. For example, transparent materials which can serve as the plurality of light condensing layers 241 and 242 may include inorganic materials such as silicon oxide, silicon nitride, and titanium nitride. The light condensing layers 241 and 242 may have a single-layer structure or multilayer structure in which transparent materials having different refractive indexes are stacked. When the plurality of light condensing layers is provided, the refractive indexes of the light condensing layers may vary depending on location. The refractive index of the light condensing layer located at a higher level may be smaller than the light condensing layer located at a lower level. That is, the refractive indexes of the light condensing layers may increase as the light condensing layers are adjacent to the photoelectric conversion element 220 or the focusing layer 230.

The color filter layer 250 for color separation may be formed over the focusing layer 230 to cover the pixel lens 240 and have a flat surface. Since the color filter layer 250 is in contact with the pixel lens 240 and covers the pixel lens 240, light transmission between the color filter layer 250 and the pixel lens 240 can be improved. That is, light condensing efficiency can be improved. The color filter layer 250 may include a red filter, a green filter, a blue filter, a cyan filter, a yellow filter, a magenta filter, an infrared pass filter, an infrared cutoff filter, a white filter, or a combination thereof. To further improve the light condensing efficiency, the color filter layer 250 may have a smaller refractive index than the pixel lens 240.

The anti-reflection structure 260 or 270 may be formed over the color filter layer 250 and include an anti-reflection layer 260 or a hemispherical lens 270. The anti-reflection layer 260 may include two or more material layers which have different refractive indexes and are alternately stacked one or more times. The hemispherical lens 270 may not only prevent reflection of incident light, but also condense light incident on the pixel lens 240.

As the image sensor having the above-described structure includes the pixel lens 240 having a multilayer stepped structure, the light condensing efficiency in the unit pixel 110 can be improved. Furthermore, as the color filter layer 250 has a shape to cover the pixel lens 240, the light condensing efficiency in the unit pixel 110 can be further improved. As the light condensing efficiency in the unit pixel 110 is improved, quantum efficiency in the photoelectric conversion element 220 can also be improved. As a result, the performance of the image sensor can be improved.

As seen in FIG. 1, the image sensor includes a pixel array 100 in which a plurality of unit pixels 110 has been arrayed in a two-dimensional manner. The plurality of unit pixels 110 of the pixel array 100 may include three or more kinds of pixels. The three or more pixels may include a red pixel, a green pixel, and a blue pixel. The red pixel, the green pixel, and the blue pixel may include different color filters, that is, a blue filter, a green filter, and a red filter. If a pixel lens optimized for incident light is provided, further improved light condensing efficiency can be implemented because the incident light subjected to color separation through each of the color filters has a different wavelength.

An image sensor including a pixel lens effective for color-separated incident light is described below with reference to FIGS. 3 to 7. The same reference numerals are used to denote the same elements for convenience of description.

Figure 3:
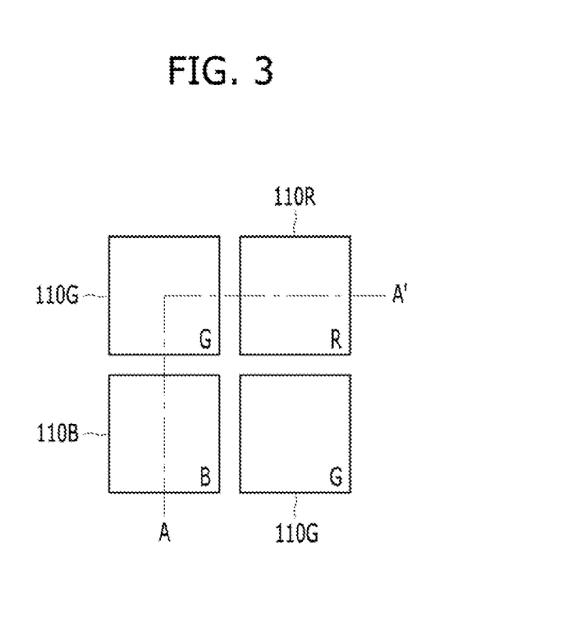
FIG. 3 is a plan view illustrating part of a pixel array in an image sensor in accordance with an embodiment of the present invention.
Figure 4:
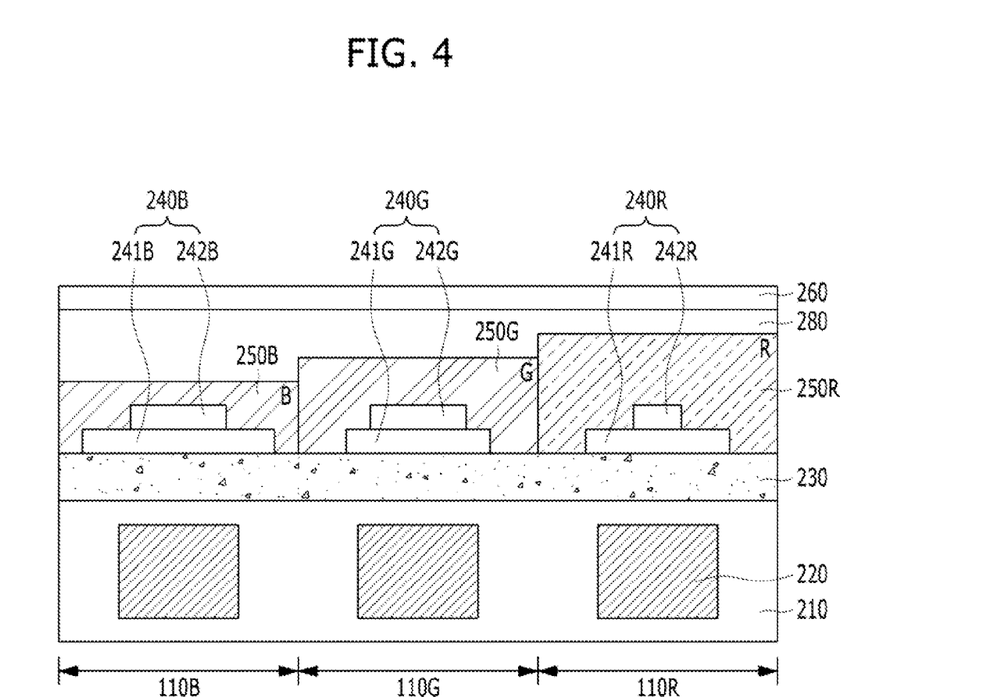
FIG. 4 is a cross-sectional view of the image sensor taken along line A-A' of FIG. 3 in accordance with an embodiment of the present invention.
Figure 5:
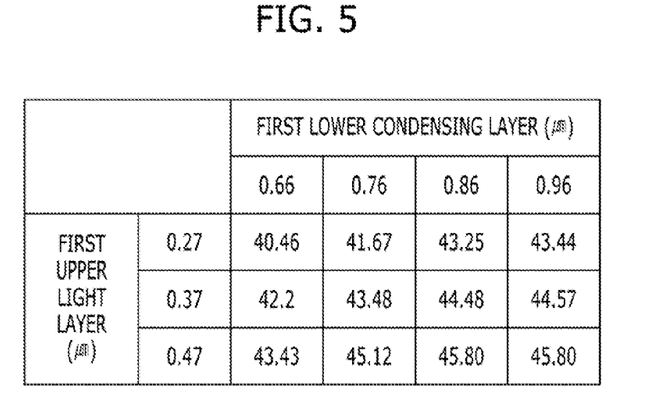
FIGS. 5 to 7 are tables illustrating the results of simulations for illustrating quantum efficiency according to pixel lens conditions in a blue pixel, a green pixel, and a red pixel.
Figure 6:
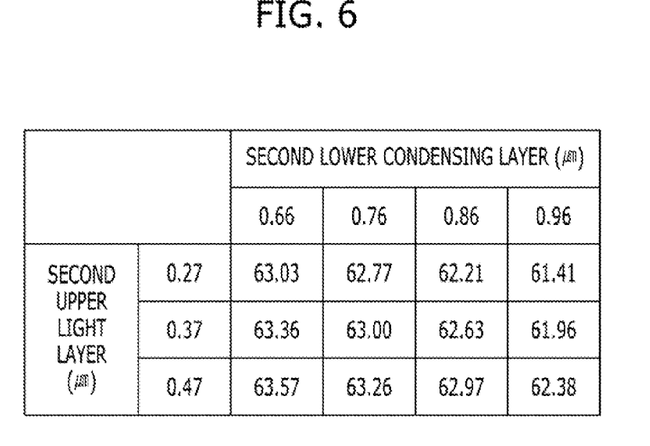
Figure 7:
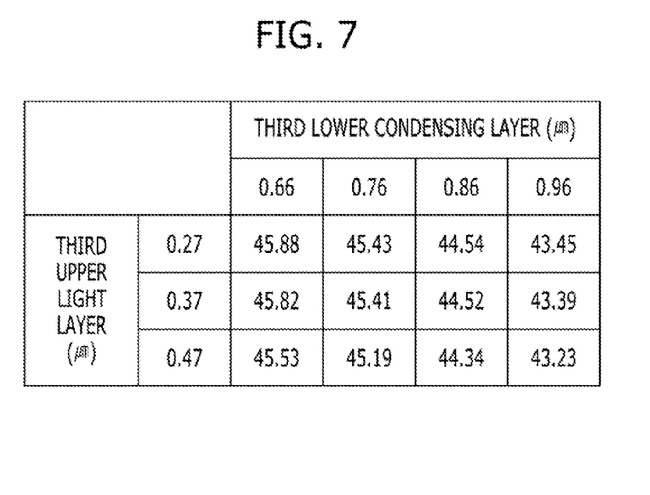

FIG. 3 is a plan view illustrating part of a pixel array in an image sensor in accordance with an embodiment of the present invention, FIG. 4 is a cross-sectional view of the image sensor taken along line A-A' of FIG. 3, and FIGS. 5 to 7 are tables illustrating the results of simulations for illustrating quantum efficiency according to pixel lens conditions in a blue pixel, a green pixel, and a red pixel.

As illustrated in FIGS. 3 and 4, the pixel array of the image sensor according to an embodiment may include a blue pixel 110B, a green pixel 110G, and a red pixel 110R, which may be disposed in a bayer pattern.

The blue pixel 110B, the green pixel 110G, and the red pixel 110R may include respective photoelectric conversion elements 220 formed on a substrate 210, a focusing layer 230, respective pixel lenses 240B, 240G, and 240R configured to have upper light condensing layers 242B, 242G, and 242R smaller in area or width than respective lower light condensing layers 241B, 241G, and 241R, a color filter layer including a plurality of color filters 250B, 250G, and 250R, a planarization layer 280 on the color filter layer, and an anti-reflection structure on the planarization layer 280. The focusing layer 230 may have the same thickness in all the pixels.

The plurality of color filters 250B, 250G, and 250R may be the blue filter 250B, the green filter 250G, and the red filter 250R, respectively, so that they respectively correspond to the blue pixel 110B, the green pixel 110G, and the red pixel 110R. The planarization layer 280 functions to remove a step between the color filters 250B, 250G, and 250R. If the color filters 250B, 250G, and 250R have a flat surface, the planarization layer 280 may be omitted. Furthermore, the anti-reflection structure may include an anti-reflection layer 260 or a hemispherical lens.

Each of the pixel lenses 240B, 240G, and 240R corresponding to the respective blue, green, and read pixels 110B, 110G, and 110R has a multi-layer step shape in which a plurality of light condensing layers 241 and 242 has been stacked. The plurality of light condensing layers 241 and 242 may have different widths from each other. The plurality of light condensing layers 241 and 242 may have the same thickness.

The pixel lens of the blue pixel 110B, hereinafter referred to as the blue pixel lens 240B, may include the first lower light condensing layer 241B and the first upper light condensing layer 242B on the first lower light condensing layer 241B. From FIG. 5, it may be seen that the blue pixel lens 240B has improved characteristics as the width of the first lower light condensing layer 241B and the width of the first upper light condensing layer 242B are increased. For reference, simulation conditions on the blue pixel lens 240B were as follows. A pixel size was 1.12 μm, the wavelength of incident light was 450 nm, and a chief ray angle (CRA) was 30°.

The pixel lens of the green pixel 110G, hereinafter referred to as the green pixel lens 240G, may include the second lower light condensing layer 241G and the second upper light condensing layer 242G on the second lower light condensing layer 241G. From FIG. 6, it may be seen that the green pixel lens 240G has improved characteristics as the width of the second lower light condensing layer 241G is reduced and the width of the second upper light condensing layer 242G is increased. For reference, simulation conditions on the green pixel lens 240G were as follows. A pixel size was 1.12 μm, the wavelength of incident light was 530 nm, and the CRA was 30°.

When the blue pixel lens 240B is compared with the green pixel lens 240G, the first lower light condensing layer 241B may have a greater width than the second lower light condensing layer 241G, and the first upper light condensing layer 242B may have the same width as the second upper light condensing layer 242G.

The pixel lens of the red pixel 110R, hereinafter referred to as the red pixel lens 240R, may include the third lower light condensing layer 241R and the third upper light condensing layer 242R on the third lower light condensing layer 241R. From FIG. 7, it may be seen that the red pixel lens 240R has improved characteristics as the width of the third lower light condensing layer 241R and the width of the third upper light condensing layer 242R are reduced. For reference, simulation conditions on the red pixel lens 240R were as follows. A pixel size was 1.12 μm, the wavelength of incident light was 620 nm, and the CRA was 30°.

When the blue pixel lens 240B is compared with the red pixel lens 240R, the first lower light condensing layer 241B may have a greater width than the third lower light condensing layer 241R, and the first upper light condensing layer 242B may also have a greater width than the third upper light condensing layer 242R. When the green pixel lens 240G is compared with the red pixel lens 240R, the second lower light condensing layer 241G and the third lower light condensing layer 241R may have the same width, and the second upper light condensing layer 242G may have a greater width than the third upper light condensing layer 242R.

The aforementioned image sensor can improve light condensing efficiency in the unit pixels 110B, 110G, and 110R more effectively by providing the pixel lenses 240B, 240G, and 240R having their widths controlled so that the pixel lenses 240B, 240G, and 240R correspond to incident light whose color has been separated through the color filters 250B, 250G, and 250R. As described above, quantum efficiency in the photoelectric conversion element 220 can also be improved because light condensing efficiency in the unit pixels 110B, 110G, and 110R is improved. As a result, performance of the image sensor can be improved.

This technology can improve light condensing efficiency in a unit pixel by controlling the width of a corresponding pixel lens so that the pixel lens corresponds to the wavelength of incident light whose color has been separated by a corresponding color filter.

As described above, quantum efficiency in the photoelectric conversion element can also be improved because light condensing efficiency in a unit pixel is improved. As a result, performance of the image sensor can be improved.

The image sensor in accordance with an embodiment of the present invention may be used in various electronic devices or systems. Hereafter, the image sensor in accordance with an embodiment of the present invention which is applied to, for example, a camera will be described with reference to FIG. 8.

Figure 8:
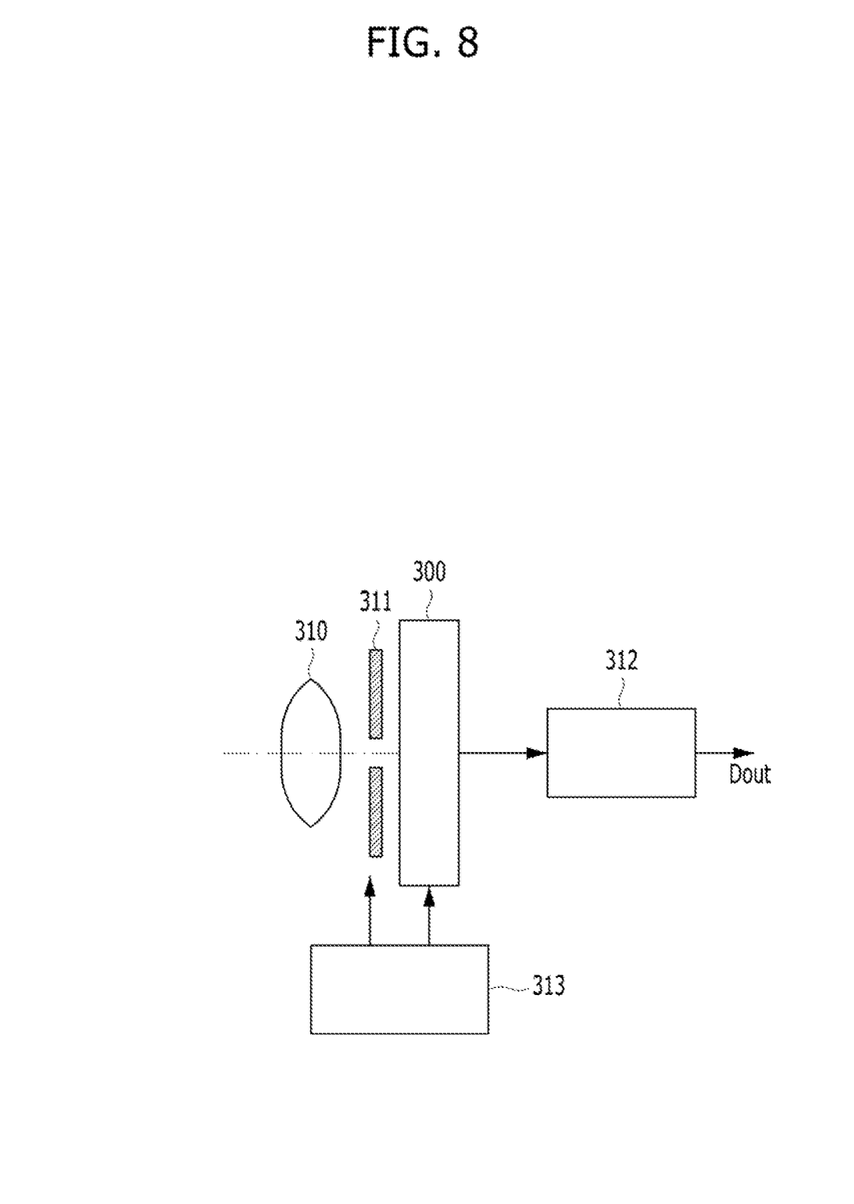
FIG. 8 is a diagram illustrating an electronic device including an image sensor in accordance with an embodiment of the present invention.

FIG. 8 is a diagram briefly illustrating an electronic device including an image sensor in accordance with an embodiment of the present invention. Referring to FIG. 8, the electronic device including the image sensor in accordance with an embodiment of the present invention may include a camera capable of taking a still image or moving image. The electronic device may include an optical system or optical lens 310, a shutter unit 311, a driving unit 313 for controlling/driving an image sensor 300 and the shutter unit 311, and a signal processing unit 312.

The optical system 310 may guide image light that is, incident light, from an object to the pixel array 100 (refer to FIG. 1) of the image sensor 300. The optical system 310 may include a plurality of optical lenses. The shutter unit 311 may control a light exposure period and a light shield period for the image sensor 300. The driving unit 313 may control a transmission operation of the image sensor 300 and a shutter operation of the shutter unit 311. The signal processing unit 312 may process signals outputted from the image sensor 300 in various manners. The processed image signals Dout may be stored in a storage medium such as a memory or outputted to a monitor or the like.

What is claimed is:
1. An image sensor, comprising:
first and second photoelectric conversion elements formed in a first pixel and a second pixel of a substrate, respectively;
a first pixel lens formed over the first photoelectric conversion element of the first pixel and comprising a first lower light condensing layer and a first upper light condensing layer, wherein the first upper light condens- ing layer has a smaller width than the first lower light condensing layer and is formed over the first lower light condensing layer;
a first color filter covering the first pixel lens and filtering a visible ray of a first wavelength band;
a second pixel lens formed over the second photoelectric conversion element of the second pixel and comprising a second lower light condensing layer and a second upper light condensing layer, wherein the second upper light condensing layer has a smaller width than the second lower light condensing layer and is formed over the second lower light condensing layer, wherein the second pixel lens has a width different from a width of the first pixel lens; and
a second color filter covering the second pixel lens and filtering a visible ray of a second wavelength band longer than the first wavelength band.

2. The image sensor of claim 1, further comprising:
a focusing layer inserted between the first photoelectric conversion element and the first pixel lens and between the second photoelectric conversion element and the second pixel lens; and
an anti-reflection structure formed over the first and the second color filters.

3. The image sensor of claim 2, wherein the focusing layer has a greater refractive index than the first and the second pixel lenses.

4. The image sensor of claim 2, wherein the focusing layer has a greater area than the first and the second pixel lenses.

5. The image sensor of claim 2, wherein the anti-reflection structure comprises an anti-reflection layer or a hemispherical lens,
wherein the anti-reflection layer includes two or more substance layers having different refractive indices from each other,
wherein the two or more substance layer are stacked alternately and repeatedly.

6. The image sensor of claim 1, wherein each of the first and the second pixel lenses has a multi-layer step shape.

7. The image sensor of claim 1,
wherein the first color filter comprises a blue filter,
wherein the second color filter comprises a green filter,
wherein a width of the first lower light condensing layer is greater than a width of the second lower light condensing layer, and
wherein a width of the first upper light condensing layer is substantially the same as a width of the second upper light condensing layer.

8. The image sensor of claim 1,
wherein the first color filter comprises a green filter,
wherein the second color filter comprises a red filter,
wherein a width of the first lower light condensing layer is substantially the same as a width of the second lower light condensing layer, and
wherein a width of the first upper light condensing layer is greater than a width of the second upper light condensing layer.

9. The image sensor of claim 1,
wherein the first color filter comprises a blue filter,
wherein the second color filter comprises a red filter,
wherein a width of the first lower light condensing layer is greater than a width of the second lower light condensing layer, and
wherein a width of the first upper light condensing layer is greater than a width of the second upper light condensing layer.

10. The image sensor of claim 1,
wherein a width of the first lower light condensing layer exposed by the first upper light condensing layer in the first pixel lens is smaller than a wavelength of incident light subjected to color separation through the first color filter, and
wherein a width of the second lower light condensing layer exposed by the second upper light condensing layer in the second pixel lens is smaller than a wavelength of incident light subjected to color separation through the second color filter.

11. An image sensor, comprising:
first, second, and third photoelectric conversion elements formed in a substrate so as to correspond to a first pixel, a second pixel, and a third pixel, respectively;
a first pixel lens formed over the first photoelectric conversion element and comprising a first lower light condensing layer and a first upper light condensing layer, wherein the first upper light condensing layer has a smaller width than the first lower light condensing layer and is formed over the first lower light condensing layer;
a first color filter covering the first pixel lens and filtering a visible ray of a first wavelength band;
a second pixel lens formed over the second photoelectric conversion element and comprising a second lower light condensing layer and a second upper light condensing layer, wherein the second upper light condensing layer has a smaller width than the second lower light condensing layer and is formed over the second lower light condensing layer;
a second color filter covering the second pixel lens and filtering a visible ray of a second wavelength band longer than the first wavelength band;
a third pixel lens formed over the third photoelectric conversion element and comprising a third lower light condensing layer and a third upper light condensing layer, wherein the third upper light condensing layer has a smaller width than the third lower light condensing layer and is formed over the third lower light condensing layer; and
a third color filter covering the third pixel lens and filtering a visible ray of a third wavelength band longer than the second wavelength band,
wherein the first pixel lens, the second pixel lens, and the third pixel lens have different widths from each other.

12. The image sensor of claim 11, wherein:
the first color filter comprises a blue filter,
the second color filter comprises a green filter, and
the third color filter comprises a red filter.

13. The image sensor of claim 11, wherein:
a width of the first lower light condensing layer is greater than each of a width of the second lower light condensing layer and a width of the third lower light condensing layer, and
the width of the second lower light condensing layer is substantially the same as the width of the third lower light condensing layer.

14. The image sensor of claim 13, wherein:
a width of the first upper light condensing layer is substantially the same as a width of the second upper light condensing layer, and
each of the width of the first upper light condensing layer and the width of the second upper light condensing layer, is greater than a width of the third upper light condensing layer.

15. An electronic device, comprising:
an optical system;
an image sensor suitable for receiving light from the optical system; and
a signal processing unit suitable for performing a signal processing operation on a signal output from the image sensor,
wherein the image sensor comprises:
first and second photoelectric conversion elements formed in a substrate and corresponding to a first pixel and a second pixel, respectively;
a first pixel lens formed over the first photoelectric conversion element and comprising a first lower light condensing layer and a first upper light condensing layer, wherein the first upper light condensing layer has a smaller width than the first lower light condensing layer and is formed over the first lower light condensing layer;
a first color filter covering the first pixel lens and filtering a visible ray of a first wavelength band;
a second pixel lens formed over the second photoelectric conversion element of the second pixel and comprising a second lower light condensing layer and a second upper light condensing layer, wherein the second upper light condensing layer has a smaller width than the second lower light condensing layer, is formed over the second lower light condensing layer, and has a width different from a width of the first pixel lens; and
a second color filter covering the second pixel lens and filtering a visible ray of a second wavelength band longer than the first wavelength band.

16. The electronic device of claim 15, further comprising:
a focusing layer inserted between the first photoelectric conversion element and the first pixel lens and between the second photoelectric conversion element and the second pixel lens; and
an anti-reflection structure formed over the first and the second color filters.

17. The electronic device of claim 15, wherein each of the first and the second pixel lenses has a multi-layer step shape.

18. The electronic device of claim 15,
wherein the first color filter comprises a blue filter,
wherein the second color filter comprises a green filter,
wherein a width of the first lower light condensing layer is greater than a width of the second lower light condensing layer, and
wherein a width of the first upper light condensing layer is substantially the same as a width of the second upper light condensing layer.

19. The electronic device of claim 15,
wherein the first color filter comprises a green filter,
wherein the second color filter comprises a red filter,
wherein a width of the first lower light condensing layer is substantially the same as a width of the second lower light condensing layer, and
wherein a width of the first upper light condensing layer is greater than a width of the second upper light condensing layer.

20. The electronic device of claim 15,
wherein the first color filter comprises a blue filter,
wherein the second color filter comprises a red filter,
wherein a width of the first lower light condensing layer is greater than a width of the second lower light condensing layer, and
wherein a width of the first upper light condensing layer is greater than a width of the second upper light condensing layer.

* * * * *